United States Patent
Sasaki et al.

(10) Patent No.: US 7,292,455 B2
(45) Date of Patent: Nov. 6, 2007

(54) MULTILAYERED POWER SUPPLY LINE FOR SEMICONDUCTOR INTEGRATED CIRCUIT AND LAYOUT METHOD THEREOF

(75) Inventors: Seiichiro Sasaki, Tokyo (JP); Kouji Morita, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 233 days.

(21) Appl. No.: 10/812,962

(22) Filed: Mar. 31, 2004

(65) Prior Publication Data
US 2005/0115740 A1 Jun. 2, 2005

(30) Foreign Application Priority Data
Nov. 27, 2003 (JP) ............................. 2003-397724

(51) Int. Cl.
*H05K 1/14* (2006.01)
(52) U.S. Cl. ........................ 361/794; 361/311; 361/761
(58) Field of Classification Search ............... 361/794, 361/306.1–306.3, 311, 313, 360, 321, 761, 361/763, 766, 734, 738; 257/296, 297, 298, 257/724, 686
See application file for complete search history.

(56) References Cited

U.S. PATENT DOCUMENTS

| | | | |
|---|---|---|---|
| 6,331,931 B1 * | 12/2001 | Titizian et al. ........... | 361/306.3 |
| 6,646,860 B2 * | 11/2003 | Takaramoto et al. ..... | 361/306.3 |
| 6,876,059 B2 * | 4/2005 | Sano .......................... | 257/532 |
| 7,009,832 B1 * | 3/2006 | Chen et al. .............. | 361/306.1 |
| 2002/0113292 A1 * | 8/2002 | Appel | |
| 2003/0206389 A1 * | 11/2003 | Hajimiri et al. ......... | 361/306.1 |

FOREIGN PATENT DOCUMENTS

| | | |
|---|---|---|
| JP | 09-246476 | 9/1997 |
| JP | 2000-311964 | 11/2000 |

* cited by examiner

*Primary Examiner*—Dean A. Reichard
*Assistant Examiner*—Yuriy Semenenko
(74) *Attorney, Agent, or Firm*—Rabin & Berdo, PC

(57) ABSTRACT

The present invention provides a multilayered power supply line suitable for use in a semiconductor integrated circuit and a layout method thereof. In the multilayered power supply line (10) for the semiconductor integrated circuit, a top metal (12) and a second metal (14) are electrically connected to each other by through holes (18). Further, a capacitor metal (16) is electrically connected to the top metal (12) by through holes (20) to thereby make the top metal (12), the second metal (14) and the capacitor metal (16) identical in potential to one another, whereby the multilayered power supply line functions as a power supply line based on normal wiring metals without functioning as a capacitor. It is thus possible to supply power with reduced impedance.

6 Claims, 5 Drawing Sheets

MULTILAYERED POWER SUPPLY LINE
FOR SEMICONDUCTOR INTEGRATED
CIRCUIT AND LAYOUT METHOD THEREOF

BACKGROUND OF THE INVENTION

1. Field of the Invention

The present invention relates to a multilayered power supply line of an MTM (Metal-Insulator-Metal) structure, which supplies power to an I/O (Input/Output) buffer and an internal circuit in a semiconductor integrated circuit, and a method of laying out the multilayered power supply line.

This application is counterpart of Japanese patent application, Serial Number 397724/2003, filed Nov. 27, 2003, the subject matter of which is incorporated herein by reference.

2. Description of the Related Art

As general multilayered power supply lines each suitable for use in a semiconductor integrated circuit, which supply power to I/O buffers and internal circuits, there have heretofore been known one laid out with a wiring metal of one layer being provided in such a power supply line as shown in FIG. 9, and one laid out using a multilayered wiring metal such that the impedance of a power supply line becomes low. A sectional view of the power supply line shown in FIG. 9, which is taken along a dotted line 98, is shown in FIG. 10.

As such a multilayered wiring metal, there has been known a power supply line described in the following Patent Document 1, for example. In the present power supply line, a first metal layer is added to an area free of an I/O buffer of a chip corner unit, and parallel plate condensers are respectively formed between the first metal layer, and a VDD power supply line and a GND power supply line to increase capacity, thereby making it possible to reduce noise caused by switching of the I/O buffer.

Since a first power supply wiring layer supplied with a power supply or source potential from an external power supply, and a second power supply wiring layer supplied with a ground potential are formed in multilayer form in a semiconductor device described in the following Patent Document 2, the wiring resistances of the first and second power supply wiring layers can be reduced. Therefore, a power supply or source potential low in impedance and a ground potential can be supplied to each circuit block in an internal circuit.

Patent Document 1

Japanese Laid-Open patent No. 1997-246476.

Patent Document 2

Japanese Laid-Open patent No. 2000-311964

Methods such as expanding of a wiring width, multilayering of wirings as in the case of the above-described Patent Documents 1 and 2 or the like have been used in the multilayered power supply lines employed in the semiconductor integrated circuits in order to reduce impedance.

However, a chip area increases with the expansion of the wiring width, and wiring's multilayering encounters difficulties in wiring other signal lines. Since the VDD and GND power supply lines are relatively small in capacity, switching noise is apt to occur in the semiconductor integrated circuit.

SUMMARY OF THE INVENTION

The present invention has been made to solve the drawbacks of such prior arts and aims to provide a multilayered power supply line which supplies power to an I/O buffer and an internal circuit at low impedance without expanding the width of each of power supply lines and multilayering them and without making it difficult to wire other signal lines, and a layout method thereof.

According to one aspect of the present invention, there is provided a multilayered power supply line of an MIM (Metal-Insulator-Metal) structure, comprising:

a first metal layer which serves as a wiring metal;

a second metal layer located below the first metal layer; and a third metal layer serving as a capacitor metal, which is located between the first metal layer and the second metal layer, wherein an insulator is embedded into gap portions defined among these metal layers, the second metal layer is electrically connected to the first metal layer and thereby supplied with power identical in potential to the first metal layer, and the third metal layer is electrically connected to the first metal layer and thereby supplied with the power identical in potential to the first metal layer.

According to another aspect of the present invention (this aspect is referred to as aspect 1), there is provided a method of laying out a multilayered power supply line having an MIM structure wherein a first metal layer that serves as a wiring metal is disposed over a second metal layer, a third metal layer that serves as a capacitor metal is disposed between the first metal layer and the second metal layer, and an insulator is embedded into gap portions defined among these metal layers, the method comprising the following steps of:

electrically connecting the second metal layer to the first metal layer to allow the first metal layer and the second metal layer to be identical in potential to each other; and electrically connecting the third metal layer to the first metal layer to allow the first metal layer and the third metal layer to be identical in potential to each other.

Furthermore, following various aspects are disclosed in the specification. These aspects are as follows.

A method according to the aspect 1, further comprises the step of: causing the second metal layer and the third metal layer to be identical in potential to each other and thereby using the third metal layer as a wiring metal. (Aspect 2)

A method according to aspect 2, further comprising the step of:

supplying a source potential of an external power supply to the first metal layer and supplying the source potential of the external power supply even to the second metal layer and the third metal layer. (Aspect 3)

A method according to aspect 2, further comprising the step of:

supplying a ground potential to the first metal layer and supplying the ground potential even to the second metal layer and the third metal layer. (Aspect 4)

A method according to aspect 1, further comprising the steps of:

alternately disposing, as the first metal layer, metal layers supplied with the source potential of the external power supply and metal layers supplied with the ground potential, and constituting capacitors in potential different positions between the first metal layer and the second metal layer and between the first metal layer and the third metal layer. (Aspect 5)

A method according to aspect 5, further comprising the steps of:

constituting a first 3-layer multilayered power supply line by a second metal layer supplied with the ground potential and a third metal layer supplied with the source potential of the external power supply, and constituting a second 3-layer multilayered power supply line by a second metal layer supplied with the source potential of the external power supply and a third metal layer supplied with the ground potential. (Aspect 5)

A method according to aspect 5, further comprising the step of constituting, in the first metal layer, a capacitor using a parasitic capacitance developed between a metal layer supplied with the source potential of the external power supply and a metal layer supplied with the ground potential. (Aspect 6)

A method of laying out a multilayered power supply line including a capacitor metal, comprising the following steps of:

using the capacitor metal as a wiring metal with being substituted therewith; and increasing the wiring metal by one layer on a pseudo basis. (Aspect 7)

According to the multilayered power supply line of the present invention, a metal, which is originally used as a capacitor metal, is used as a wiring metal in a wiring metal 3-layer multilayered power supply line of an MIM structure so as to become identical in potential to a top metal and a second metal, thereby making it possible to reduce the impedance of the power supply line. At this time, the multilayered power supply line of the present invention does not interfere with wiring of other signal lines.

According to the present invention as well, in a multilayered power supply line, parallel-running VDD power supply lines and GND power supply lines are alternately superposed on one another, and a normal capacitor made up of a capacitor metal and a second metal and a second capacitor made up of a top metal and a capacitor metal are used, so that switching noise can be reduced with the capacitors each having large capacity. Each capacitor metal is caused to function as a source or power supply line, thereby making it possible to obtain a low impedance multilayered power supply line while being held in a chip area identical in size to the conventional one.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Preferred embodiments of the present invention will hereinafter be described in detail with reference to the accompanying drawings.

Figure 3:
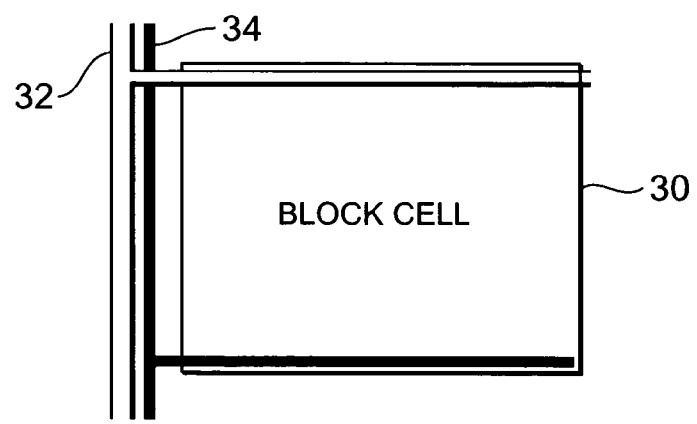
FIG. 3 is a schematic diagram depicting the multilayered power supply line shown in FIG. 1 applied to a block cell.
Figure 4:
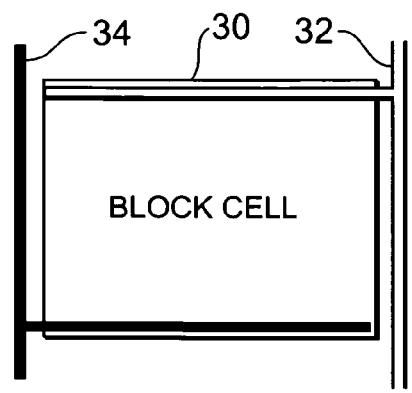
FIG. 4 is a schematic diagram showing the multilayered power supply line shown in FIG. 1 applied to a block cell.
Figure 5:
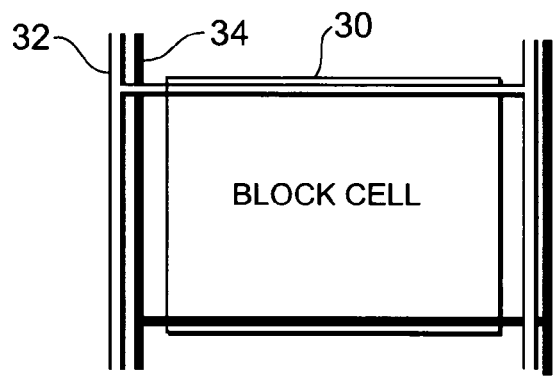
FIG. 5 is a schematic diagram illustrating the multilayered power supply line shown in FIG. 1 applied to a block cell.
Figure 6:
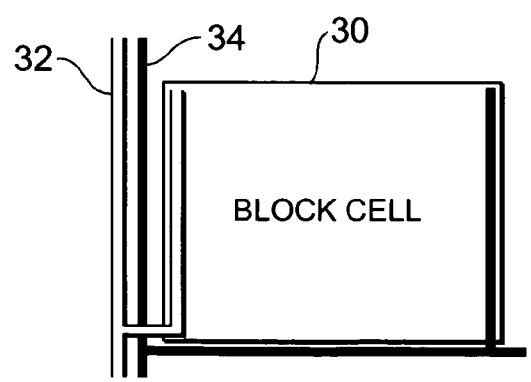
FIG. 6 is a schematic diagram depicting the multilayered power supply line shown in FIG. 1 applied to a block cell.

One embodiment of a multilayered power supply line employed in a semiconductor integrated circuit, according to the present invention will next be explained in detail with reference to the accompanying drawings. The multilayered power supply line 10 according to the present embodiment can be applied to both a VDD power supply line for supplying a power supply or source potential and a GND power supply line for supplying a ground potential. The VDD power supply line and the GND power supply line to which the multilayered power supply line 10 is applied, may be wired so as to surround the periphery of a block cell 30 as shown in FIG. 3, for example or may be wired as shown in FIG. 4, 5 or 6. Part of the VDD power supply line shown in FIG. 3 is shown in an enlarged form, and a sectional view across the length of the VDD power supply line shown in FIG. 1, which is taken along a dotted line 50, is shown in FIG. 2.

Figure 1:
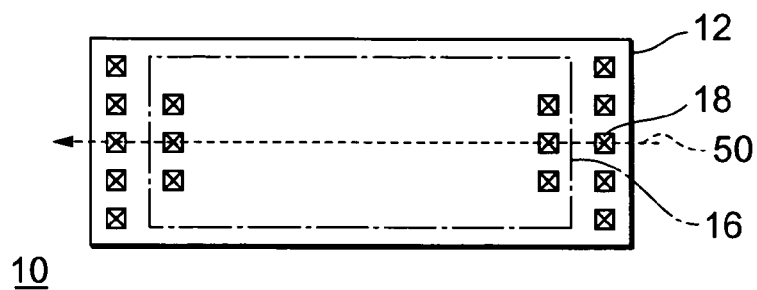
FIG. 1 is a diagram showing one embodiment of a multilayered power supply line according to the present invention.
Figure 2:
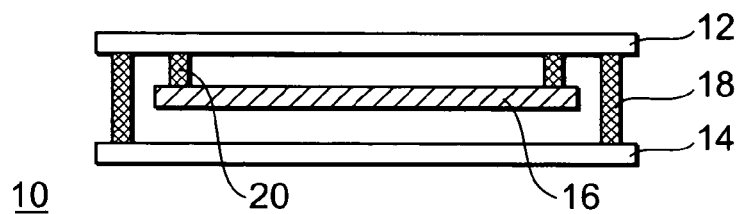
FIG. 2 is a diagram illustrating, in sectional form, the multilayered power supply line shown in FIG. 1.

Referring to FIGS. 1 and 2, the embodiment of the multilayered power supply line 10 employed in the semiconductor integrated circuit, according to the present invention is configured in such a manner that a top metal 12 and a second metal 14 are electrically connected to each other by through holes 18, and a capacitor metal 16 is electrically connected to the top metal 12 by through holes 20. The embodiment of the multilayered power supply line 10 supplies power to an I/O buffer and an internal circuit employed in the semiconductor integrated circuit. Incidentally, a diagrammatic illustration of portions directly irrelevant to the understanding of the present invention is omitted and redundant descriptions will therefore be avoided.

In the present embodiment, conductive materials such as aluminum, copper, cobalt, etc. may be used for the top metal 12, the second metal 14, the capacitor metal 16, the through holes 18 and the through holes 20. In the multilayered power supply line 10, an insulator such as silicon oxide ($SiO_2$) is embedded into gap or clearance portions defined among these materials.

In a manner similar to a metal 3-layer MIM capacitor process or the like, the multilayered power supply line 10 according to the present embodiment is made up of three layers: the top metal 12, the second metal 14 corresponding to a bottom plate, and the capacitor metal 16 corresponding to a top plate. Since, however, the second metal 14 is electrically connected to the top metal 12 via the through holes 18 in the present invention, the second metal 14 becomes identical in potential to the top metal 12. Particularly since the capacitor metal 16 is used as a wiring metal and electrically connected to the top metal 12 via the through holes 20, the capacitor metal 16 becomes identical in potential to the top metal 12.

The multilayered power supply line 10 can be applied to both the VDD power supply line and the GND power supply line. For instance, when the top metal 12 is of a VDD power supply level, the second metal 14 and the capacitor metal 16 result in the VDD power supply level. When the top metal 12 is a GND power supply level, the second metal 14 and the capacitor metal 16 result in the GND power supply level.

Thus, the top metal 12, the second metal 14 and the capacitor metal 16 become identical to one another in potential. The multilayered power supply line 10 according to the present embodiment does not function as a capacitor but as a multilayered power supply line using a normal wiring metal, e.g., a low-impedance multilayered power supply line as in a wiring metal 3-layer multilayered power supply line or the like.

Since the multilayered power supply line 10 results in three layers without being formed as two layers when the top metal 12, the second metal 14 and the capacitor metal 16 employed in the multilayered power supply line 10 are respectively identical in wiring width, the source impedance simply results in $2/3$. This means that assuming that current consumption of a headphone amplifier is 20 mA in the case of a low impedance drive circuit (e.g., 16-$\Omega$ load drive in the case of the headphone amplifier), only a difference in 1 $\Omega$ occurs in the source impedance and a voltage drop in the power supply normally results in 20 mV. In the multilayered power supply line according to the present embodiment at this time, the voltage drop results in 13 mV of $2/3$, so that a larger effect is obtained. When the multilayered power supply line according to the present embodiment is used in a digital circuit, the width of each power supply line can be reduced while the impedance is being maintained as it is, thus making it possible to bring about the expectation of high integration.

Figure 7:
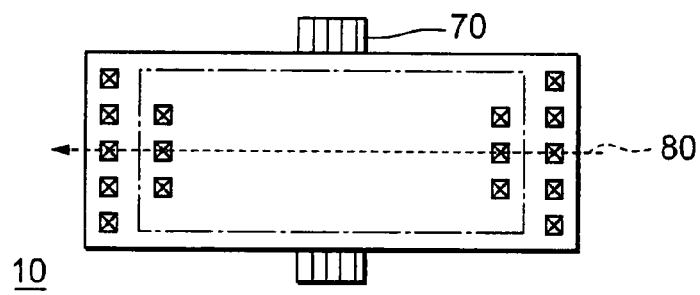
FIG. 7 is a diagram showing a signal line wired to the multilayered power supply line shown in FIG. 1.
Figure 8:
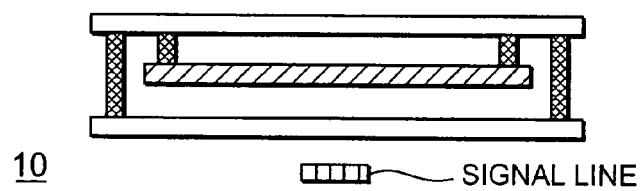
FIG. 8 is a diagram illustrating, in sectional form, the multilayered power supply line shown in FIG. 7 and the signal line.
Figure 9:
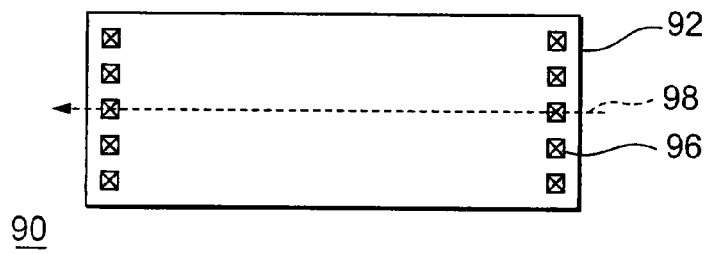
FIG. 9 is a diagram depicting a conventional multilayered power supply line.
Figure 10:
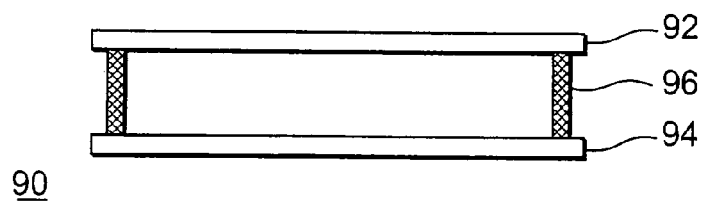
FIG. 10 is a diagram showing, in sectional form, the conventional multilayered power supply line shown in FIG. 9.

Applying a method of laying out the multilayered power supply line as described in the present invention makes it possible to increase the wiring metal by one layer on a pseudo or dummy basis owing to the substituted use of the capacitor metal as the wiring metal in the metal 3-layer MIM capacitor process or the like containing the capacitor metal, for example. At this time, the multilayered power supply line 10 according to the present embodiment is capable of maintaining the 3-layer multilayered power supply line without increasing a chip area and impedance of each power supply line and interfering with wiring of a signal line 70 or the like as shown in FIG. 7. A sectional view of the multilayered power supply line shown in FIG. 7, which is taken along a dotted line 80, is illustrated in FIG. 8. Since the capacitor metal 16 is located between the top metal 12 and the second metal 14 in the present embodiment, there is little effect of affecting the signal line 70 by the multilayered power supply line 10. Thus, the substitution of the capacitor metal with the wiring metal can be applied not only to the 3-layer multilayered power supply line but also to a multilayered power supply line of four or more layers.

Figure 11:
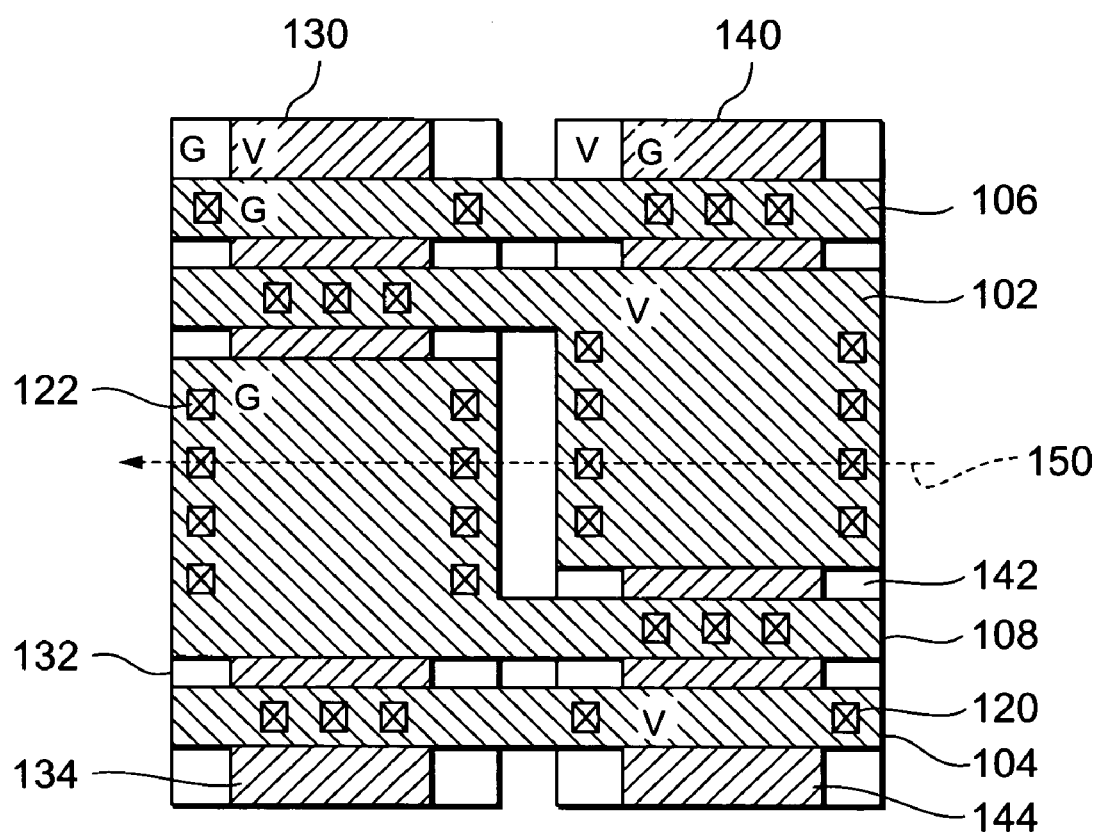
FIG. 11 is a diagram illustrating another embodiment of a multilayered power supply line according to the present invention.

As another embodiment, as shown in FIG. 11, a multilayered power supply line 100 is configured in such a manner that a plurality of VDD power supply lines and GND power supply lines run parallel to one another and 3-layer multilayered power supply lines 130 and 140 having VDD power supply lines and GND power supply lines run parallel to each other. The 3-layer multilayered power supply lines 130 and 140 may respectively be configured as in the case of, for example, a metal 3-layer MIM capacitor process.

In the multilayered power supply line 100 according to the present embodiment, as shown in FIG. 11, top metals 102, 104, 106 and 108 are provided so as to cross over the 3-layer multilayered power supply lines 130 and 140. Top, capacitor and second metals are made up of VDD and GND power lines arranged alternately. At this time, the top metals 102 and 104 are electrically connected to the corresponding second metal 142 in the 3-layer multilayered power supply line 140 and the corresponding capacitor metal 134 in the 3-layer multilayered power supply line 130 via through holes 120. The top metals 106 and 108 are electrically connected to the corresponding second metal 132 in the 3-layer multilayered power supply line 130 and the corresponding capacitor metal 144 in the 3-layer multilayered power supply line 140 via through holes 122.

In the present embodiment, the top metals 102 and 104 are supplied with a power supply or source potential by being connected to an unillustrated external power supply or the like and function as VDD power supply lines. On the other hand, the top metals 106 and 108 are grounded and thereby supplied with a ground potential although not shown in the drawing and function as GND power supply lines.

Thus, since the second metal 144 and the capacitor metal 134 are respectively connected to the top metals 102 and 104 corresponding to the VDD power supply lines, they are supplied with the power supply potential and function as the VDD power supply lines. Since the second metal 132 and the capacitor metal 144 are connected to their corresponding top metals 106 and 108 corresponding to the GND power supply lines, they are supplied with the ground potential and function as the GND power supply lines.

Figure 12:
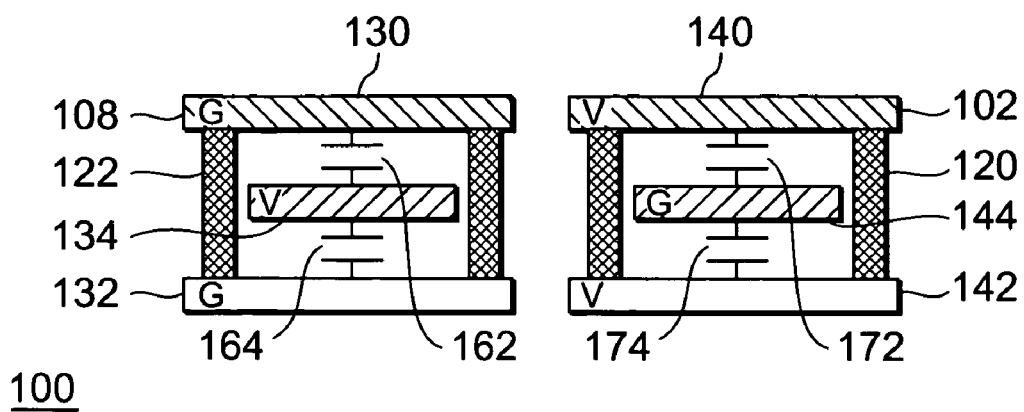
FIG. 12 is a diagram showing, in sectional form, the multilayered power supply line shown in FIG. 11.

Now, a sectional view of the multilayered power supply line shown in FIG. 11, which is taken along a dotted line 150, is illustrated in FIG. 12. As a result, the 3-layer multilayered power supply line 130 in which the top metal 108 and the second metal 132 are connected via the through holes 122, and the 3-layer multilayered power supply line 140 in which the top metal 102 and the second metal 142 are connected via the through holes 120, are shown in the figure.

At this time, in the 3-layer multilayered power supply line 130, the capacitor metal 134 corresponding to the VDD power supply line is wired between the top metal 108 and the second metal 132 both corresponding to the GND power supply lines. Therefore, a difference in potential occurs between the top metal 108 and the capacitor metal 134 so that the capacitor metal 134 functions as a parallel plate condenser 162. A difference in potential occurs between the second metal 132 and the capacitor metal 134 so that the capacitor metal 134 functions as a parallel plate condenser 164.

On the other hand, in the 3-layer multilayered power supply line 140, the capacitor metal 144 is wired between the top metal 102 and the second metal 142 both corresponding to the VDD power supply lines. Therefore, a difference in potential occurs between the top metal 102 and the capacitor metal 144 so that the capacitor metal 144 functions as a parallel plate condenser 172. A difference in potential occurs between the second metal 142 and the capacitor metal 144 so that the capacitor metal 144 functions as a parallel plate condenser 174.

These parallel plate condensers 162, 164, 172 and 174 allow the capacitor metals 134 and 144 to function as the VDD and GND power supply lines respectively.

Thus, the multilayered power supply line 100 according to the present embodiment is provided with the parallel-running VDD power supply lines and GND power supply lines alternately superposed on one another and includes the second capacitor comprised of the top metal and the capacitor metal in addition to the normal capacitor made up of the capacitor metal and the second metal. Thus, the multilayered power supply line 100 has the capacitor having capacity larger than one where it has the normal capacitor alone, so that switching noise can be reduced. Further, the capacitor metal is caused to function as the power supply line, so that a low impedance power supply line can be obtained while it is being held in a chip area identical in size to the conventional one.

In the present embodiment, the top metal is low in impedance because it is thicker than other metals, and is advantageously used in both the VDD and GND power supply lines.

Applying the multilayered power supply line according to the present embodiment to a ring of an I/O buffer makes it possible to reduce source impedance and switching noise developed due to an increase in capacitance between a VDD power supply and a GND power supply without increasing the chip area and changing a process.

The multilayered power supply line 100 according to the present embodiment has been configured in such a manner that the parallel-running VDD power supply lines and GND power supply lines overlap alternately. However, as in a multilayered power supply line 180 shown in FIG. 13, metals each corresponding to a VDD power supply line and metals each corresponding to a GND power supply line are alternately laid out in top metals 182. Thereafter, a second metal 184 and a capacitor metal 184 may be electrically connected to these metals. At this time, a difference in potential occurs between the adjacent top metals 182 so that parasitic capacity increases. Further, the parasitic capacity is set as a bypass condenser in addition to a capacitor between the top metal 182 and the second metal 184 and a capacitor between the top metal 182 and the capacitor metal 186, thereby making it possible to reduce switching noise.

Figure 13:
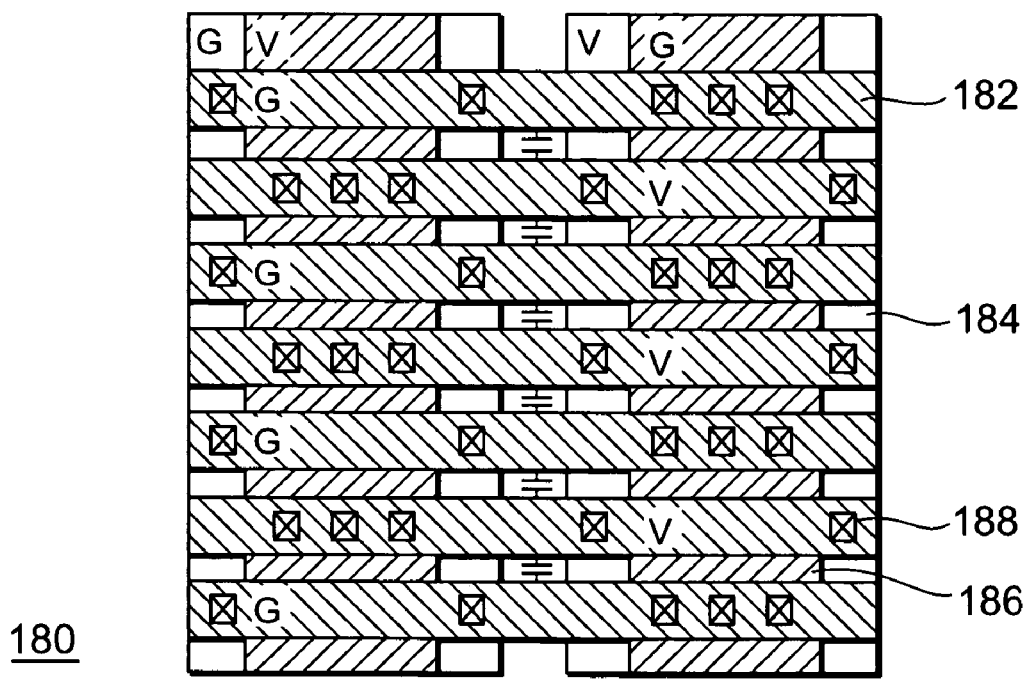
FIG. 13 is a diagram illustrating a further embodiment of a multilayered power supply line according to the present invention.

It is to be noted that FIGS. 1 and 2 show that the first metal layer (first metal strip) 12, the second metal layer (second metal strip) 14, and the third metal layer (third metal strip) 16 are all lengthwise mutually parallel, and the third metal strip 16 is sandwiched in a gap between the first metal strip 12 and the second metal strip 14. FIG. 1 also shows that the first metal strip 12 and the second metal strip 14 are identical in wiring width, while the third metal strip 16 is narrower (FIG. 7 shows this feature also). FIG. 12 illustrates that pairs of metal strips (e.g., 108 and 102); or, 132 and 142; or, 134 and 144) form a generally planar layer consisting of those strips; and that the source potential V and the ground potential G alternate in adjacent strips of the first metal strip and the third metal strip, and the potential is similar in adjacent strips of the first metal strip and the second metal strip. FIG. 12 also shows that the plurality of strips are arranged in a rectangular array, while FIG. 13 shows that they are mutually parallel.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A multilayered power supply line having a metal-insulator-metal structure, and comprising:

a plurality of strips, including:

a first metal strip to serve as a wiring metal;

a second metal strip located below the first metal strip; and a third metal strip to serve as a capacitor metal, said third metal strip being sandwiched between the first metal strip and the second metal strip; and an insulator embedded into gap portions defined among the first metal strip, the second metal strip, and the third metal strip;

wherein the first metal strip, the second metal strip, and the third metal strip are lengthwise mutually parallel, wherein the second metal strip is electrically connected to the first metal strip and thereby supplied with power equal in potential to the first metal strip, wherein the first metal strip and the second metal strip are equal in wiring width, wherein some of the strips are supplied with a source potential of an external power supply and others of the strips are supplied with a ground potential, wherein the source potential and the ground potential alternate in first metal strips which are disposed in a generally planar layer consisting of a plurality of the first metal strip, wherein the source potential and the ground potential alternate in adjacent strips of the first metal strip and the third metal strip, and wherein the potential is similar in adjacent strips of the first metal strip and the second metal strip, whereby capacitors are configured by potential differences between the first metal strip and the second metal strip and between the first metal strip and the third metal strip.

2. The multilayered power supply line according to claim 1, further comprising:

a first 3-layer multilayered power supply line having a second metal strip supplied with the ground potential and a third metal strip supplied with the source potential of the external power supply, and a second 3-layer multilayered power supply line having a second metal strip supplied with the source potential of the external power supply and a third metal strip supplied with the ground potential.

3. The multilayered power supply line according to claim 1, which includes, in the first metal strip, a capacitor made up of a parasitic capacitance developed between a metal strip supplied with the source potential of the external power supply and a metal strip supplied with the ground potential.

4. The multilayered power supply line according to claim 1, wherein the third metal strip has the same wiring width of the first metal strip and the second metal strip.

5. The multilayered power supply line according to claim 1, wherein the third metal strip is narrower than the wiring width of the first metal strip and the second metal strip.

6. The multilayered power supply line according to claim 1, wherein the plurality of strips are mutually parallel and are arranged in a rectangular array.

* * * * *